(12) United States Patent
Rogel-Favila et al.

(10) Patent No.: US 9,618,574 B2
(45) Date of Patent: Apr. 11, 2017

(54) CONTROLLING AUTOMATED TESTING OF DEVICES

(71) Applicant: Advantest Corporation, Tokyo (JP)

(72) Inventors: Ben Rogel-Favila, San Jose, CA (US); Padmaja Nalluri, Sunnyvale, CA (US); Kirsten Allison, Mountain View, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/736,166

(22) Filed: Jun. 10, 2015

(65) Prior Publication Data

US 2015/0355279 A1 Dec. 10, 2015

Related U.S. Application Data

(63) Continuation-in-part of application No. 14/515,422, filed on Oct. 15, 2014, and a continuation-in-part of (Continued)

(51) Int. Cl.
*G01R 31/01* (2006.01)
*G01R 31/28* (2006.01)

(52) U.S. Cl.
CPC ................ *G01R 31/2893* (2013.01)

(58) Field of Classification Search
CPC ............ G01R 31/2637; G01R 31/2801; G01R 31/2806; G01R 31/2808; G01R 31/281; G01R 31/2812; G01R 31/2834; G01R 31/2851; G01R 31/286; G01R 31/2863; G01R 31/2865; G01R 31/2867; G01R 31/2868; G01R 31/31905; G01R 31/31908; G01R 1/04; G01R 21/26
USPC ............ 324/750.22, 750.03, 750.16, 750.24, 324/756.01, 756.02, 73.1, 756.05, 324/757.01–757.05, 763, 757.01–757.05
See application file for complete search history.

(56) References Cited

U.S. PATENT DOCUMENTS 4,038,599 A * 7/1977 Bove ................... G01R 1/07314
324/73.1
4,560,058 A * 12/1985 Enochs ................ B65G 47/082
198/426

(Continued)

OTHER PUBLICATIONS

Interview Summary of U.S. Appl. No. 14/736,107 dated Nov. 15, 2016.*

*Primary Examiner* — Patrick Assouad
*Assistant Examiner* — Sean Curtis

(57) ABSTRACT

In an embodiment, a method includes causing a test floor system to insert a DUT (device under test) into a DUT receptacle. This is performed in a manner that couples the DUT to an electrical interface of the DUT receptacle and that encloses the DUT inside the DUT receptacle to facilitate testing of the DUT. Also, the method includes causing the test floor system to transport the DUT receptacle that encloses the DUT to a tester of the test floor system and to insert the DUT receptacle into a DUT testing module of the tester. Further, the method includes causing the test floor system to determine identification information of the DUT. Furthermore, the method includes, based on the identification information, sending a test routine to the DUT testing module to perform on the DUT.

20 Claims, 12 Drawing Sheets

Related U.S. Application Data application No. 14/515,417, filed on Oct. 15, 2014, and a continuation-in-part of application No. 14/515,421, filed on Oct. 15, 2014.

(60) Provisional application No. 62/009,130, filed on Jun. 6, 2014, provisional application No. 62/011,538, filed on Jun. 12, 2014.

(56) References Cited

U.S. PATENT DOCUMENTS

| | | | |
|---|---|---|---|
| 4,724,383 A | 2/1988 | Hart | |
| 4,774,462 A | 9/1988 | Black | |
| 4,777,434 A | 10/1988 | Miller et al. | |
| 4,782,291 A | 11/1988 | Blandin | |
| 4,888,549 A | 12/1989 | Wilson et al. | |
| 5,310,039 A * | 5/1994 | Butera | G01R 31/2851 198/346.2 |
| 5,329,227 A | 7/1994 | Sinclair | |
| 5,555,422 A | 9/1996 | Nakano | |
| 5,625,287 A * | 4/1997 | Nakamura | B23Q 7/1447 324/750.19 |
| 5,633,598 A | 5/1997 | Van Loan et al. | |
| 5,788,084 A | 8/1998 | Onishi et al. | |
| 5,794,783 A | 8/1998 | Carter | |
| 5,847,293 A * | 12/1998 | Jones | G01R 31/2851 324/750.08 |
| 5,945,838 A | 8/1999 | Gallagher et al. | |
| 6,008,636 A * | 12/1999 | Miller | G01R 31/01 324/757.01 |
| 6,078,188 A | 6/2000 | Bannai et al. | |
| 6,137,303 A | 10/2000 | Deckert | G01R 31/2831 324/757.03 |
| 6,194,908 B1 | 2/2001 | Wheel et al. | |
| 6,198,273 B1 | 3/2001 | Onishi et al. | |
| 6,204,679 B1 * | 3/2001 | Gray, III | G11C 29/56 324/750.08 |
| 6,339,321 B1 * | 1/2002 | Yamashita | G01R 31/01 324/750.14 |
| 6,354,792 B1 * | 3/2002 | Kobayashi | G01R 31/316 257/E23.179 |
| 6,392,433 B2 * | 5/2002 | Itasaka | G01R 1/0408 324/750.23 |
| 6,518,745 B2 | 2/2003 | Kim et al. | |
| 6,526,841 B1 | 3/2003 | Wanek et al. | |
| 6,583,638 B2 | 6/2003 | Costello et al. | |
| 6,679,128 B2 | 1/2004 | Wanek et al. | |
| 6,732,053 B1 * | 5/2004 | Aragona | G01R 31/2834 702/108 |
| 7,070,323 B2 | 7/2006 | Wanek et al. | |
| 7,091,737 B2 * | 8/2006 | Norris | G01R 31/2868 324/750.05 |
| 7,151,388 B2 * | 12/2006 | Gopal | G01R 31/2867 209/573 |
| 7,292,023 B2 | 11/2007 | Dangelo et al. | |
| 7,339,387 B2 * | 3/2008 | Dangelo | G01R 31/2863 324/750.05 |
| 7,532,023 B2 | 5/2009 | Norris | |
| 7,550,964 B2 | 6/2009 | Dangelo et al. | |
| 7,612,575 B2 | 11/2009 | Ito et al. | |
| 7,800,393 B2 | 9/2010 | Ito et al. | |
| 7,825,650 B2 | 11/2010 | Casterton et al. | |
| 7,884,631 B2 * | 2/2011 | Co | G11C 29/56 324/757.01 |
| 7,929,303 B1 * | 4/2011 | Merrow | G11B 33/128 324/73.1 |
| 7,960,992 B2 * | 6/2011 | Co | G11C 29/56016 324/757.01 |
| 8,237,461 B2 | 8/2012 | Kitazume et al. | |
| 8,248,091 B2 * | 8/2012 | Cheng | G01R 1/07371 324/754.07 |
| 8,269,507 B2 | 9/2012 | Hall | |
| 9,110,129 B1 * | 8/2015 | Ames | G01R 31/2808 |
| 9,164,050 B2 * | 10/2015 | Davies | G01N 25/72 374/46 |
| 2001/0035058 A1 * | 11/2001 | Wanek | G01R 31/2849 73/865.6 |
| 2002/0011862 A1 | 1/2002 | Kvanvig et al. | |
| 2002/0053045 A1 * | 5/2002 | Gillenwater | G06F 11/2273 714/38.14 |
| 2002/0109518 A1 | 8/2002 | Saito et al. | |
| 2002/0130654 A1 | 9/2002 | Tauchi et al. | |
| 2002/0149389 A1 * | 10/2002 | Bjork | G01R 31/2893 324/750.05 |
| 2002/0175697 A1 | 11/2002 | Miller et al. | |
| 2003/0085160 A1 * | 5/2003 | Shim | G01R 31/2887 209/573 |
| 2003/0121337 A1 | 7/2003 | Wanek et al. | |
| 2003/0173950 A1 * | 9/2003 | Flach | G01R 31/2853 324/756.05 |
| 2004/0062104 A1 * | 4/2004 | Muller | G01R 31/2891 365/201 |
| 2004/0066207 A1 * | 4/2004 | Bottoms | G01R 31/2886 324/756.02 |
| 2004/0178808 A1 | 9/2004 | Fenk | |
| 2006/0066293 A1 * | 3/2006 | Gopal | G01R 31/2867 324/750.14 |
| 2007/0063724 A1 * | 3/2007 | Roberts | G01R 31/2893 324/750.16 |
| 2008/0038098 A1 * | 2/2008 | Ito | G01R 31/31718 414/222.01 |
| 2008/0042667 A1 * | 2/2008 | Yamashita | G01R 31/31718 324/750.03 |
| 2008/0079456 A1 * | 4/2008 | Lee | G01R 31/2893 324/750.03 |
| 2008/0136439 A1 * | 6/2008 | Adam | G01R 31/2889 324/750.08 |
| 2008/0143129 A1 | 6/2008 | Wong et al. | |
| 2009/0195264 A1 * | 8/2009 | Tsen | G01R 31/2867 324/750.03 |
| 2009/0217093 A1 * | 8/2009 | Co | G01R 31/31723 714/30 |
| 2011/0012631 A1 * | 1/2011 | Merrow | G11B 33/128 324/750.03 |
| 2011/0012632 A1 * | 1/2011 | Merrow | G11B 5/4555 324/750.03 |
| 2011/0074458 A1 * | 3/2011 | Di Stefano | G01R 1/0466 324/757.01 |
| 2012/0068725 A1 | 3/2012 | Pagani | |
| 2012/0139572 A1 * | 6/2012 | Kim | G01R 31/2889 324/754.07 |
| 2012/0249177 A1 * | 10/2012 | Choi | G01R 31/2893 324/756.02 |
| 2012/0291999 A1 | 11/2012 | Lewinnek et al. | |
| 2013/0057310 A1 * | 3/2013 | Hasegawa | H01L 24/75 324/757.01 |
| 2013/0200913 A1 * | 8/2013 | Panagas | G01R 1/0441 324/756.02 |
| 2013/0200916 A1 * | 8/2013 | Panagas | G01R 1/0441 324/757.01 |
| 2014/0015559 A1 * | 1/2014 | Lee | G01R 1/0466 324/756.02 |
| 2014/0184255 A1 * | 7/2014 | Johnson | G01R 31/2834 324/750.16 |
| 2014/0218063 A1 * | 8/2014 | Roberts, Jr. | G01R 31/2601 324/756.02 |
| 2014/0306728 A1 * | 10/2014 | Arena | G01R 31/2808 324/750.08 |
| 2015/0028908 A1 | 1/2015 | Kushnick et al. | |
| 2015/0061713 A1 * | 3/2015 | Shia | G01R 1/07371 324/750.16 |
| 2015/0233967 A1 | 8/2015 | Thordarson et al. | |
| 2015/0234006 A1 * | 8/2015 | Richards | G01R 31/308 324/756.02 |
| 2015/0355229 A1 * | 12/2015 | Rogel-Favila | G01R 31/26 324/756.02 |
| 2015/0355230 A1 * | 12/2015 | Rogel-Favila | G01R 31/26 324/756.01 |

(56) References Cited

U.S. PATENT DOCUMENTS

| | | | | |
|---|---|---|---|---|
| 2015/0355231 A1* | 12/2015 | Rogel-Favila | ......... | G01R 31/26 |
| | | | | 324/750.13 |
| 2015/0355268 A1* | 12/2015 | Rogel-Favila | ..... | G01R 31/2893 |
| | | | | 324/750.08 |
| 2015/0355270 A1* | 12/2015 | Rogel-Favila | ..... | G01R 31/2874 |
| | | | | 324/750.08 |
| 2015/0355271 A1* | 12/2015 | Rogel-Favila | ..... | G01R 31/2874 |
| | | | | 324/750.08 |
| 2015/0355279 A1* | 12/2015 | Rogel-Favila | ..... | G01R 31/2893 |
| | | | | 324/750.25 |

* cited by examiner

CONTROLLING AUTOMATED TESTING OF DEVICES

CROSS-REFERENCE TO RELATED APPLICATIONS

This application is a Continuation-In-Part of and claims priority to U.S. patent application Ser. No. 14/515,422, filed on Oct. 15, 2014, which claims the benefit of and priority to U.S. Provisional Application No. 62/009,130, filed on Jun. 6, 2014, which are hereby incorporated by reference in their entirety. This application is a Continuation-In-Part of and claims priority to U.S. patent application Ser. No. 14/515,417, filed on Oct. 15, 2014, which claims the benefit of and priority to U.S. Provisional Application No. 62/009,130, filed on Jun. 6, 2014, which are hereby incorporated by reference in their entirety. This application is a Continuation-In-Part of and claims priority to U.S. patent application Ser. No. 14/515,421, filed on Oct. 15, 2014, which claims the benefit of and priority to U.S. Provisional Application No. 62/009,130, filed on Jun. 6, 2014, which are hereby incorporated by reference in their entirety.

This application claims the benefit of and priority to U.S. Provisional Application No. 62/011,538, filed on Jun. 12, 2014, which is hereby incorporated by reference in its entirety.

This application is related to U.S. patent application Ser. No. 14/736,070, U.S. patent application Ser. No. 14/736,107, and U.S. patent application Ser. No. 14/736,139, which are hereby incorporated by reference in their entirety.

FIELD

Embodiments relate to testing of devices. More specifically, embodiments relate to automated testing of devices.

BACKGROUND

Bringing a product to market generally entails a design stage, a manufacturing stage, and a testing stage. Given the competition of the marketplace, it makes sense not to de-prioritize anyone of these stages. For example, decisions made during the design stage influence whether the product will be manufacturable and/or will be testable. Also, the testing stage offers the opportunity to detect design flaws and to uncover manufacturing defects.

Typically, the testing stage is crafted as a product-centric solution or as an equipment-centric solution. In the product-centric solution, the testing set-up is focused and optimized for testing a specific product. If a different product is to be tested, another testing set-up is developed for the different product. In the case of the equipment-centric solution, specific testing equipment forms the foundation of the testing set-up. Measures are taken to deal with the limitations of the specific testing equipment in implementing the testing set-up.

SUMMARY

A new paradigm for automated device testing is presented. Instead of focusing on testing numerous of the same devices in the same testing environment (e.g., under the same temperature conditions) with the same test, the focus shifts to establishing an individualized automated testing environment for the device under the new paradigm. Due to the individualized automated testing environment, barriers such as the type of device under test (DUT) that may be tested, the type of test that may be performed, and the test conditions that may be furnished are overcome. Consequently, different DUT types, different test types, and different test conditions are possible on a test floor under the new paradigm. DUT receptacles, DUT testing modules, testers, test floor equipment, and automated control implement the new paradigm for automated device testing.

Herein, the discussion will focus on the automated control.

In an embodiment, a method includes causing a test floor system to insert a DUT (device under test) into a DUT receptacle. This is performed in a manner that couples the DUT to an electrical interface of the DUT receptacle and that encloses the DUT inside the DUT receptacle to facilitate testing of the DUT. Also, the method includes causing the test floor system to transport the DUT receptacle that encloses the DUT to a tester of the test floor system and to insert the DUT receptacle into a DUT testing module of the tester. Further, the method includes causing the test floor system to determine identification information of the DUT. Furthermore, the method includes, based on the identification information, sending a test routine to the DUT testing module to perform on the DUT.

In another embodiment, a method is described comprising: causing a test floor system to insert a plurality of different types of DUTS (devices under test) into a plurality of respective DUT (device under test) receptacles of a plurality of DUT receptacle types; causing the test floor system to transport the plurality of respective DUT receptacles that enclose the plurality of different types of DUTS to a tester of the test floor system and to insert the plurality of respective DUT receptacles into a plurality of respective DUT testing modules of the tester; causing the test floor system to determine identification information of the plurality of different types of DUTS; and based on the identification information, sending a plurality of respective test routines to the plurality of respective DUT testing modules to perform on the plurality of different types of DUTS.

In yet another embodiment, an apparatus is disclosed comprising: a controller operable to control in an automated manner a test floor system including a tester, wherein the tester includes a plurality of DUT (device under test) testing modules operable to receive and to hold a DUT receptacle that encloses a DUT to facilitate testing of the DUT, wherein the controller includes a test routine interface operable to obtain an appropriate test routine to perform on the DUT.

BRIEF DESCRIPTION OF THE DRAWINGS

The accompanying drawings, which are incorporated in and form a part of this specification, illustrate embodiments, together with the description, serve to explain the principles of the disclosure.

DETAILED DESCRIPTION

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

The individualized automated testing environment offers a wide range of flexibility. As will be explained in detail, on the device-side, a DUT (device under test) receptacle offers a uniform size and shape and a uniform physical/air/electrical interface irrespective of the size, the shape, and type of the device under test (DUT). On the testing-side, the DUT testing modules, testers, test floor equipment, and automated control are designed to interact with the uniform size and shape and the uniform physical/air/electrical interface provided by the DUT receptacle. Detailed disclosure of the automated control is provided herein. While the DUT receptacle is described in FIGS. 7-9, detailed disclosure of the DUT receptacle is found in the applications incorporated by reference herein. While the DUT testing module is described in FIGS. 10-12, detailed disclosure of the DUT testing module is found in the applications incorporated by reference herein. While the tester is described in FIG. 13, detailed disclosure of the tester is found in the applications incorporated by reference herein. While the test floor equipment is described in FIGS. 4-6, detailed disclosure of the test floor equipment is found in the applications incorporated by reference herein.

DUT Receptacle

Figure 7:
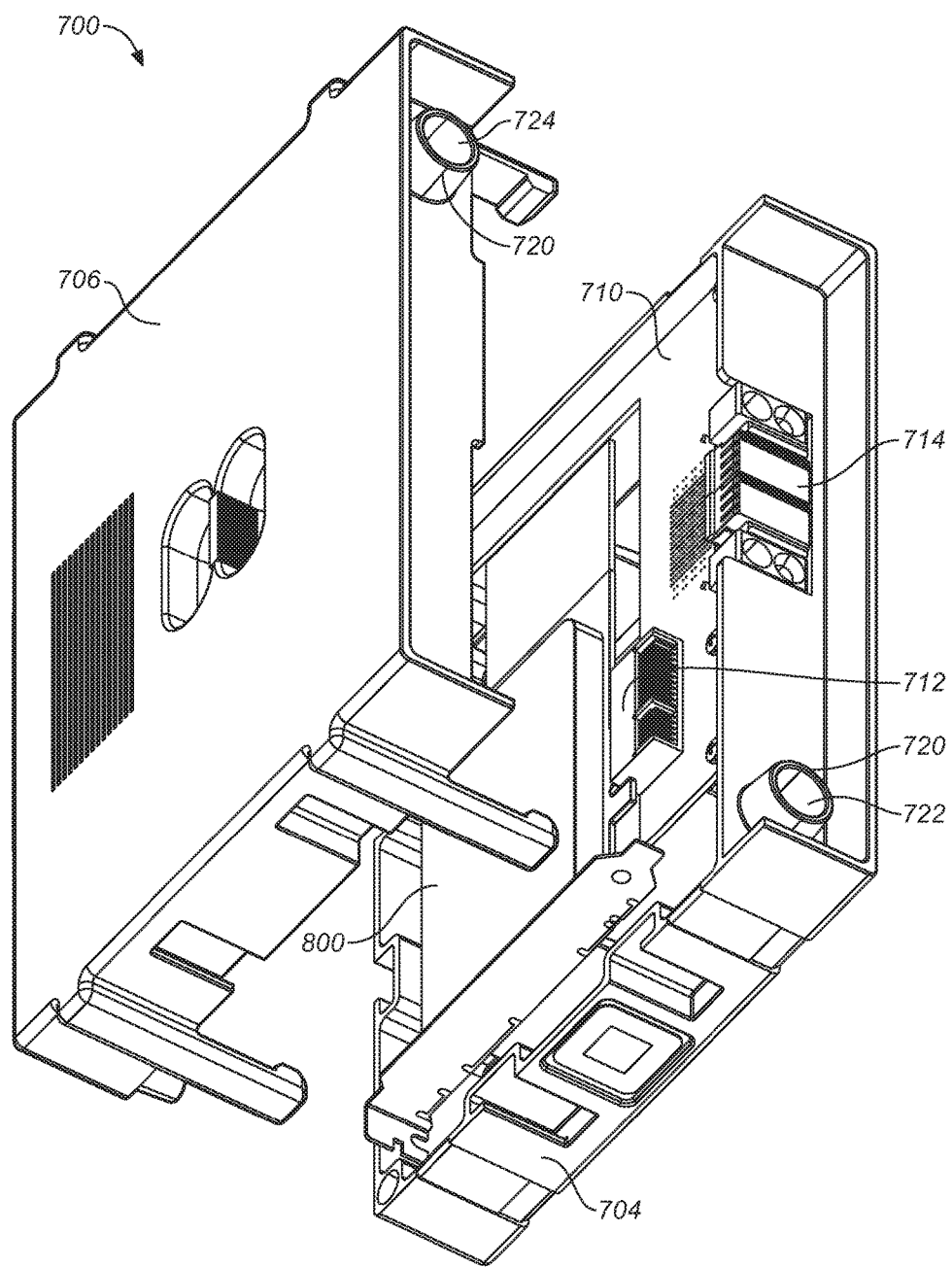
FIG. 7 illustrates an exploded view of a DUT receptacle in accordance with an embodiment, showing a DUT.
Figure 8:
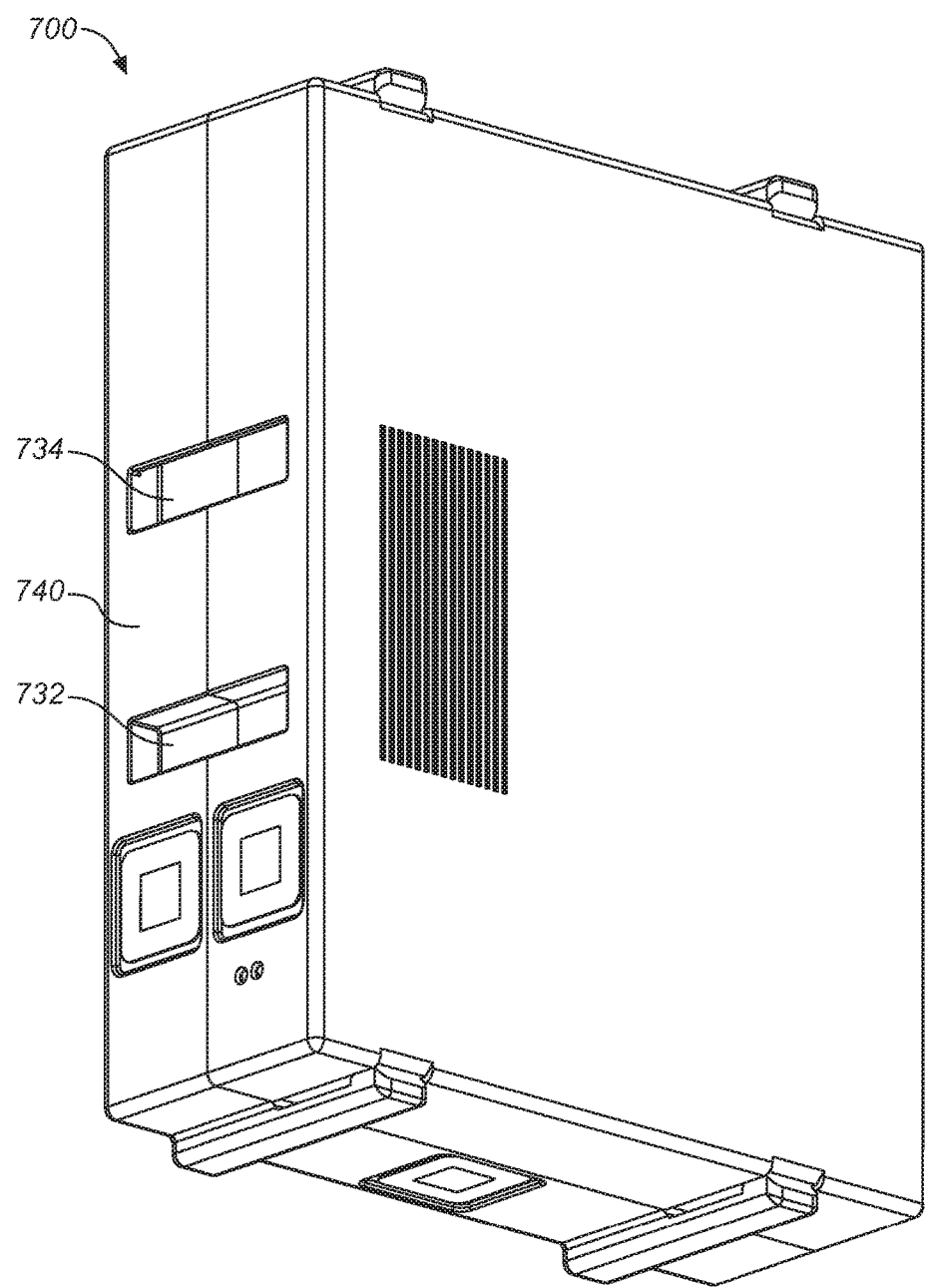
FIG. 8 illustrates a front perspective view of the DUT receptacle of FIG. 7 in accordance with an embodiment.
Figure 9:
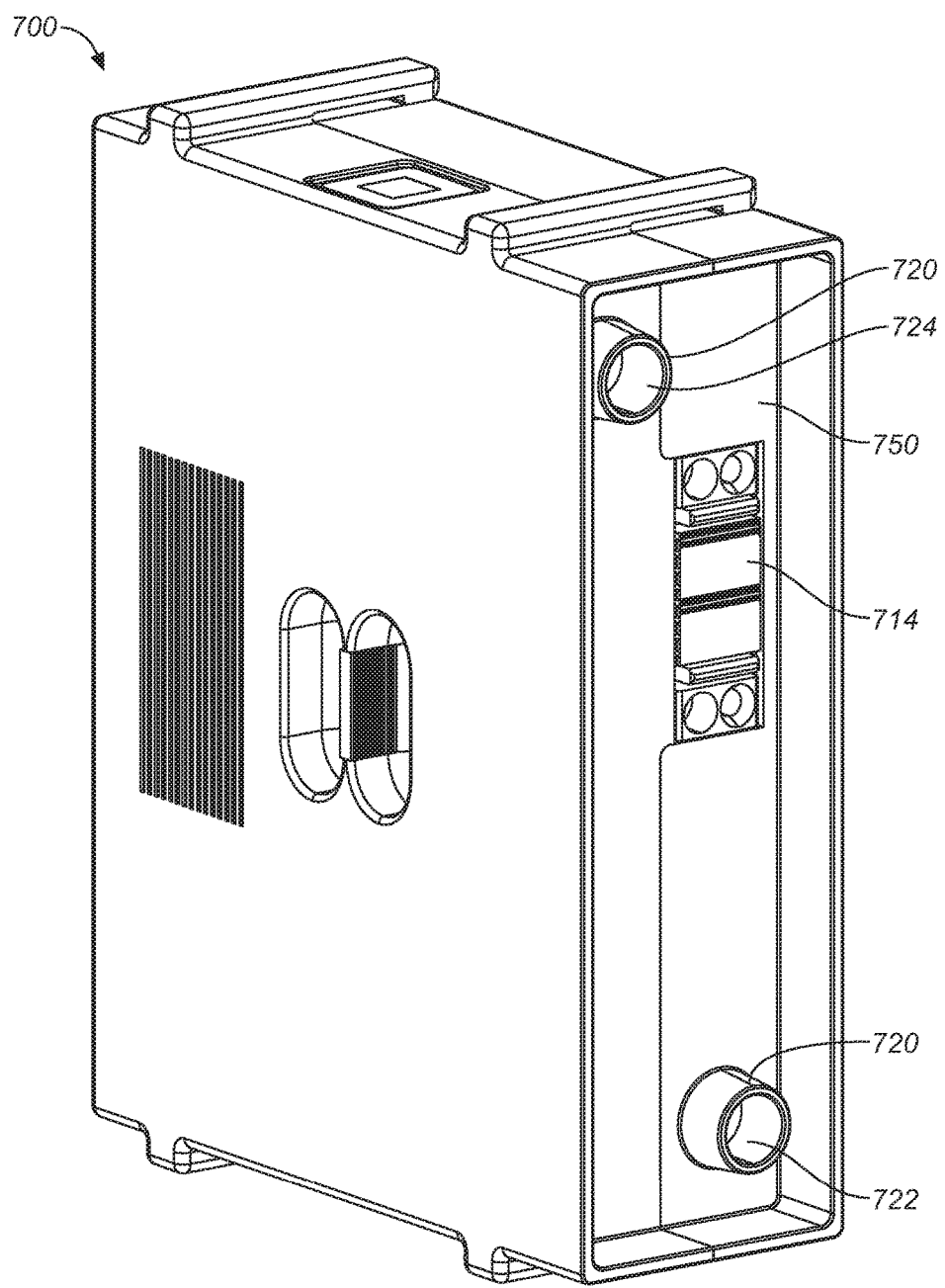
FIG. 9 illustrates a rear perspective view of the DUT receptacle of FIG. 7 in accordance with an embodiment.

Now, a brief description will be given of the DUT receptacle. FIG. 7 illustrates an exploded view of a DUT receptacle 700 in accordance with an embodiment, showing a DUT 800. FIG. 8 illustrates a front perspective view of the DUT receptacle 700 of FIG. 7 in accordance with an embodiment FIG. 9 illustrates a rear perspective view of the DUT receptacle 700 of FIG. 7 in accordance with an embodiment. It should be understood that the DUT receptacle 700 is not limited to the illustrations in FIGS. 7-9.

With reference to FIGS. 7-9, the DUT receptacle 700 provides a uniform size and shape and a uniform physical/air/electrical interface for a device under test (DUT) 800. There are may different types of devices (or DUTs) including, but not limited to, network cards, graphics cards, chips, microprocessors, hard disk drives (HDD), and solid state drives (SSD). Even within these exemplary device types, there are different device sub-types. As an example, a SSD with 500 GB storage capacity is a different type of device with respect to a SSD with 1 TB storage capacity. That is, the SSD with 1 TB storage capacity possesses features and characteristics that are different from the features and characteristics of the SSD with 500 GB storage capacity. Hence, the testing goals/requirements for the SSD with 1 TB storage capacity differ from the testing goals/requirements for the SSD with 500 GB storage capacity. Consequently, the SSD with 500 GB storage capacity is a different device type relative to the SSD with 1 TB storage capacity.

Moreover, there are numerous form factors and published specifications for devices to comply with to support compatibility and interoperability. Examples of form factors and published specifications include, but are not limited to, 3.5" HDD, 2.5" HDD, 2.5" SSD, 1.8" SSD, SATA, iSATA, PCIe, mPCIe, Fibre Channel, SAS, and USB. Rather than designing automated testing equipment (e.g., DUT (device under test) testing modules, testers, test floor equipment, and/or automated control) for a specific device type and/or a specific form factor and/or a specific published specification, the automated testing equipment (e.g., DUT testing modules, testers, test floor equipment, and/or automated control) is crafted for the uniform size and shape and the uniform physical/air/electrical interface offered by the DUT receptacle 700. Consequently, the automated testing equipment (e.g., DUT testing modules, testers, test floor equipment, and/or automated control) may be utilized with different types of devices (or DUTs) of different form factors and different published specifications.

Referring again to FIG. 7, the DUT receptacle 700 is configured to enclose and to hold inside a device under test (DUT) 800 in accordance with an embodiment. The interior of the DUT receptacle 700 may also be configured to enclose and hold inside a plurality of devices under test (DUTs) 800 in accordance with an embodiment. As shown in FIG. 7, the DUT receptacle 700 includes a base 704 to accommodate the DUT 800 and a lid 706 to securely couple to the base 704 in accordance with an embodiment. It should be understood that the DUT receptacle 700 may have any one of other configurations.

The DUT receptacle 700 also includes several other features. The DUT receptacle 700 includes an electrical interface 710 and an air flow interface 720. The electrical interface 710 includes a first connector 712 to couple to and to electrically communicate with the DUT 800 and a second connector 714 to couple to and to electrically communicate with automated testing equipment (e.g., DUT testing modules, testers, test floor equipment, and/or automated control). The air flow interface 720 includes a first air guide 722 to receive air flow from automated testing equipment (e.g., DUT testing modules, testers, test floor equipment, and/or automated control) and a second air guide 724 to output the air flow to automated testing equipment (e.g., DUT testing modules, testers, test floor equipment, and/or automated control). The air flow immerses the interior of the DUT receptacle 700 to maintain the interior of the DUT receptacle 700 at a controlled temperature, which is measured by a temperature sensor (not shown) inside the DUT receptacle 700 and reported to automated testing equipment (e.g., DUT testing modules, testers, test floor equipment, and/or automated control) via the electrical interface 710.

Now referring to FIG. 8, a front side 740 of the DUT receptacle 700 includes a first slot 732 and a second slot 734. The first slot 732 and the second slot 734 facilitate griping of the DUT receptacle 700 by automated testing equipment (e.g., testers and/or test floor equipment) for movement from one location to another location in accordance with an embodiment. It should be understood that the DUT receptacle 700 may be moved in any other manner.

With reference to FIG. 9, a rear side 750 of the DUT receptacle 700 includes the second connector 714 to couple to and to electrically communicate with automated testing equipment (e.g., DUT testing modules, testers, test floor equipment, and/or automated control) and the air flow interface 720, which has the first air guide 722 to receive air flow from automated testing equipment (e.g., DUT testing modules, testers, test floor equipment, and/or automated control) and the second air guide 724 to output the air flow to automated testing equipment (e.g., DUT testing modules, testers, test floor equipment, and/or automated control).

DUT Testing Module

Figure 10:
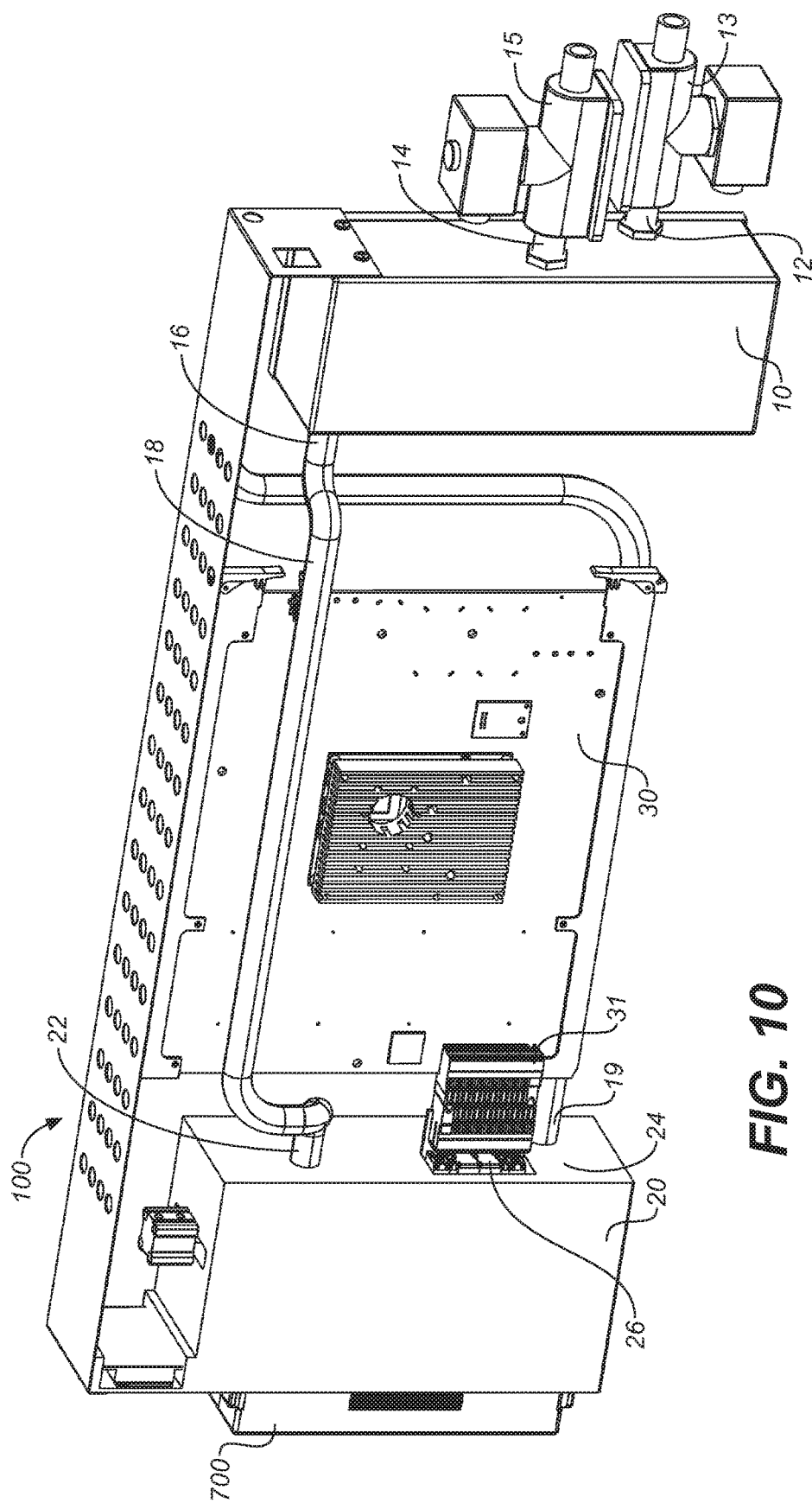
FIG. 10 depicts a side view of a DUT testing module in accordance with an embodiment, showing the DUT testing module without housing walls and showing a DUT receptacle inserted into the DUT testing module.
Figure 11:
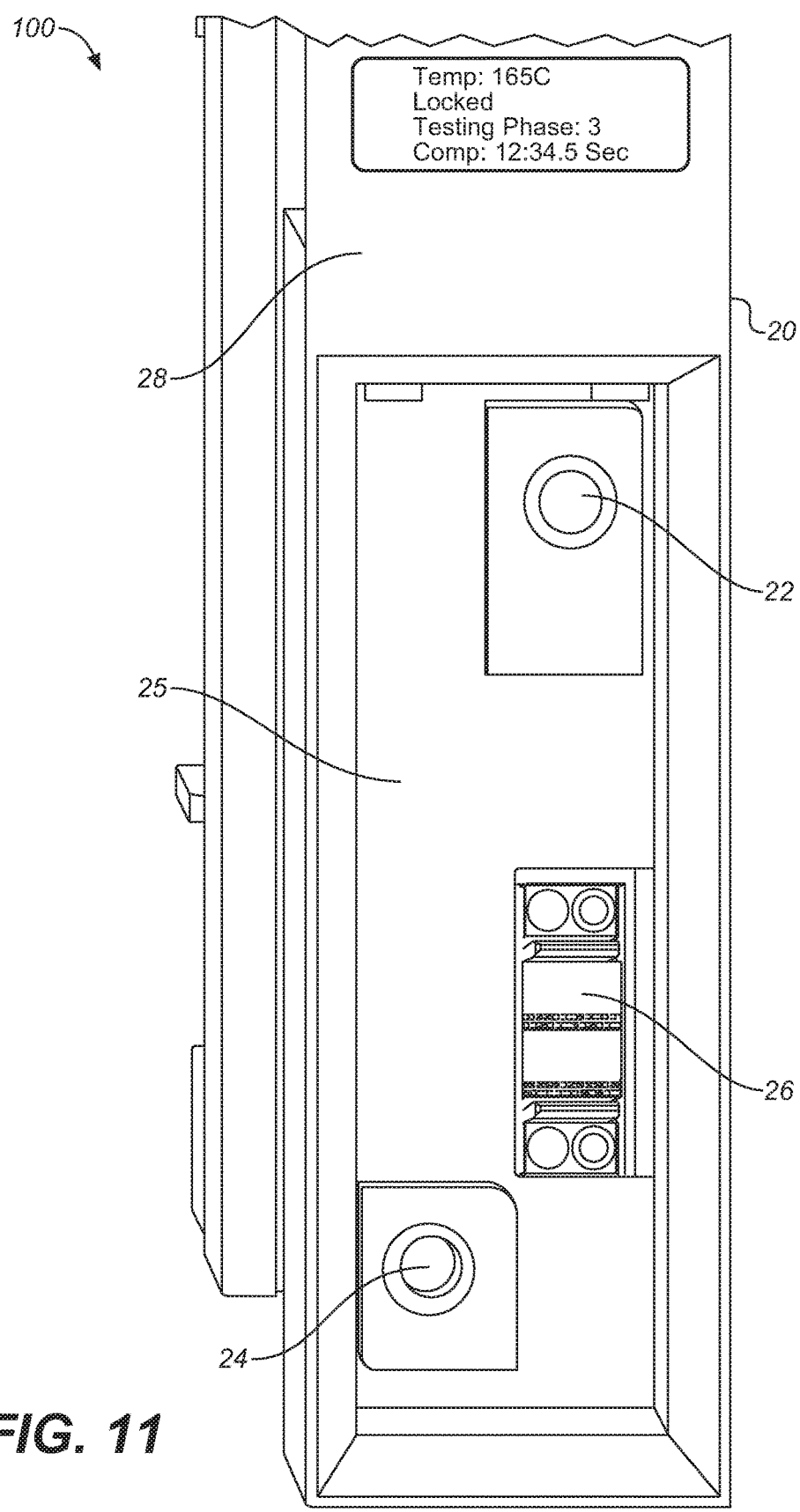
FIG. 11 shows a front view of the DUT testing module of FIG. 10 in accordance with an embodiment.
Figure 12:
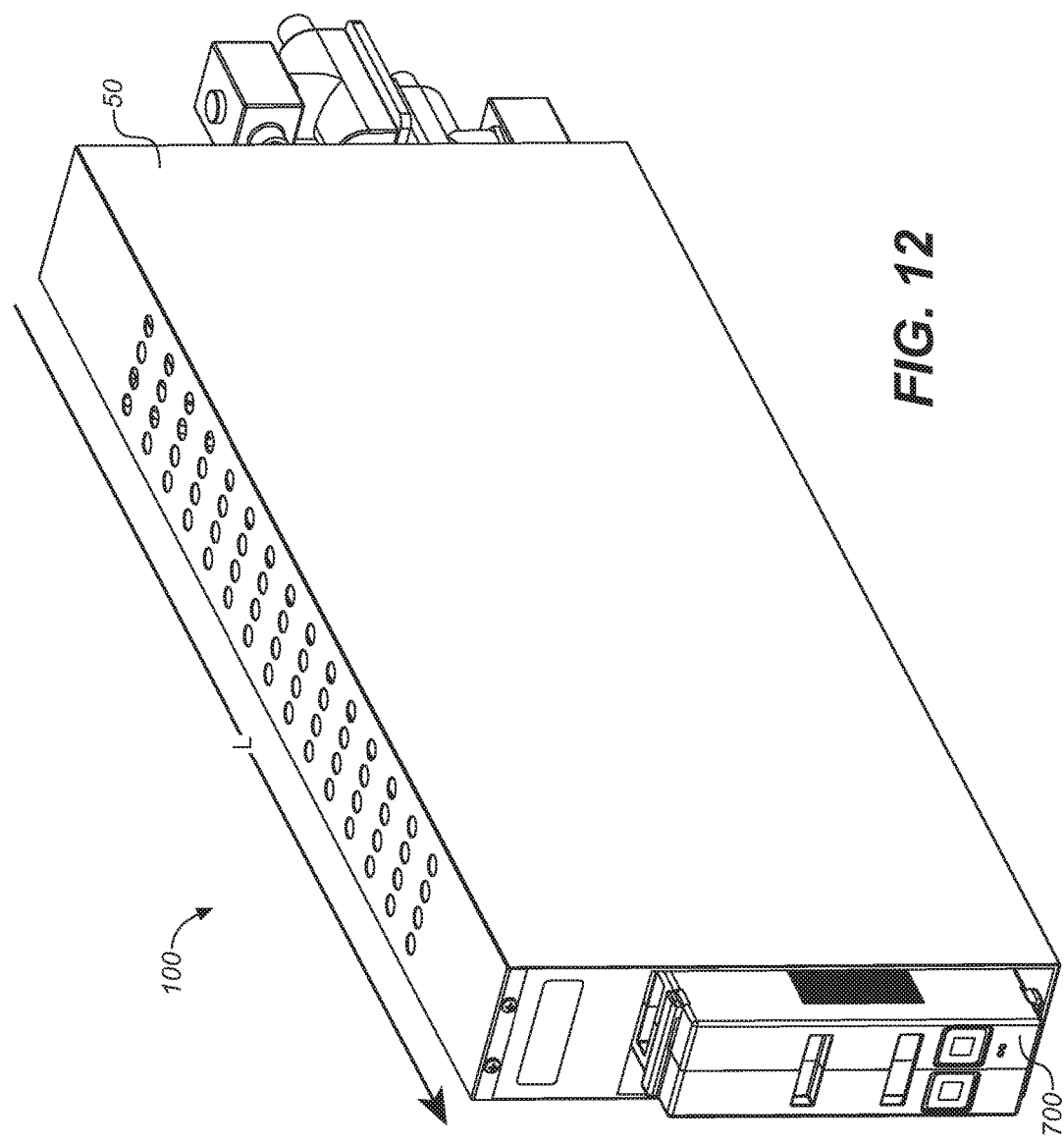
FIG. 12 illustrates a front perspective view of the DUT testing module of FIG. 10 in accordance with an embodiment, showing the DUT testing module with housing walls and showing a DUT receptacle inserted into the DUT testing module.

Now, a brief description will be given of the DUT testing module. FIG. 10 depicts a side view of a DUT testing module 100 in accordance with an embodiment, showing the DUT testing module 100 without housing walls and showing a DUT receptacle 700 inserted into the DUT testing module 100. FIG. 11 shows a front view of the DUT testing module 100 of FIG. 10 in accordance with an embodiment. FIG. 12 illustrates a front perspective view of the DUT testing module 100 of FIG. 10 in accordance with an embodiment, showing the DUT testing module 100 with housing walls and showing a DUT receptacle 700 inserted into the DUT testing module 100. It should be understood that the DUT testing module 100 is not limited to the illustrations in FIGS. 10-12.

FIG. 10 depicts a side view of a DUT (device under test) testing module 100 in accordance with an embodiment, showing the DUT testing module 100 without housing walls and showing a DUT receptacle 700 inserted into the DUT testing module 100.

As shown in FIG. 10, the DUT testing module 100 accepts the DUT receptacle 700 to establish an individualized automated testing environment. The DUT 800 (FIG. 7) inside the DUT receptacle 700 will be subjected to testing administered by the DUT testing module 100. The DUT testing module 100, the DUT receptacle 700, and the DUT 800 (FIG. 7) inside the DUT receptacle 700 are part of an individualized automated testing environment that is independent of any other DUT testing module, any other DUT receptacle, and/or any other DUT.

To support and operate in the individualized automated testing environment, the DUT testing module 100 includes an air mixing chamber 10, a docking unit 20, and a DUT test execution unit 30.

The air mixing chamber 10 outputs a mixed air flow to deliver to the interior of the DUT receptacle 700 via hose 18 while the DUT receptacle 700 permits interior air to exit via hose 19 to an external environment to ventilate or to travel to an air recycling mechanism. The mixed air flow is temperature controlled. For proper testing of the DUT 800 (FIG. 7) inside the DUT receptacle 700, test conditions may include a specific temperature or a range of temperatures to subject the DUT 800 before testing, during testing, and/or after testing. The DUT receptacle 700 includes a temperature sensor (not shown) in the interior of the DUT receptacle 700. The temperature sensor communicates with and reports measured temperature to the DUT testing module 100. Consequently, the interior temperature of the DUT receptacle 700 may be at a controlled temperature for testing by delivering the mixed air flow to the interior of the DUT receptacle 700 via hose 18 and by using the measured temperature from the temperature sensor (not shown) located in the interior of the DUT receptacle 700.

Continuing, the air mixing chamber 10 includes a first air inlet 12, a second air inlet 14, and an air outlet 16. The first air inlet 12 is operable to receive a first air flow. The second air inlet 14 is operable to receive a second air flow. The air outlet 16 is operable to output the mixed air flow via hose 18. A first valve 13 is coupled to the first air inlet 12. A second valve 15 is coupled to the second air inlet 14. Further, the first air flow is a high temperature air flow through the first air inlet 12. In an embodiment, the first air flow is at a temperature of 85° C. The second air flow is a low temperature air flow through the second air inlet 14. In an embodiment, the second air flow is at a temperature of −10° C.

In operation, the manipulation (e.g., via pneumatic control, via electronic control, or via any other manner) of the first valve 13 and the second valve 15 sends high temperature air flow and low temperature air flow into the air mixing chamber 10. Inside the air mixing chamber 10, the high temperature air flow and low temperature air flow mix together to stabilize at a controlled temperature. The controlled temperature may be adjusted by moving the first valve 13 and/or the second valve 15 towards either an opened position or a closed position. The controlled temperature may be ramp up or down or may be kept stable.

Focus is now on the docking unit 20 of the DUT testing module 100. The individualized automated testing environment is established by inserting the DUT receptacle 700 into the docking unit 20. In FIG. 11 (which shows a front view of the DUT testing module 100 of FIG. 10 in accordance with an embodiment), features of the docking unit 20 of the DUT testing module 100 are depicted. The front side 28 of the DUT testing module 100 and the docking unit 20 are illustrated in FIG. 11.

With respect to FIG. 11, the docking unit 20 includes a cavity 25, a first air opening 22, a second air opening 24, and an electrical connector 26. The cavity 25 receives and securely holds the DUT receptacle 700. Also, the cavity 25 eases and guides the DUT receptacle 700 during its insertion into the cavity 25. In an embodiment, the docking unit 20 is comprised of a plastic material (e.g., acetal homopolymer). The first air opening 22 is coupled to hose 18, which delivers the mixed air flow from the air mixing chamber 10 to the interior of the DUT receptacle 700. Moreover, the second air opening 24 is coupled to hose 19, which carries interior air from the DUT receptacle 700 to an external environment to ventilate or to an air recycling mechanism. Further, the electrical connector 26 permits electrical communication between the DUT receptacle 700 and the DUT testing module 100.

Referring still to FIG. 11, the rear side 750 (FIG. 9) of the DUT receptacle 700 is inserted into the cavity 25 of the docking unit 20. The shape of the cavity 25 is designed to accept the uniform size and shape and the uniform physical/air/electrical interface offered by the DUT receptacle 700, facilitating insertion of the DUT receptacle 700 by an automated mechanism (e.g., a gripper) into the cavity 25 irrespective of the device type, size, and form factor of the DUT 800 (FIG. 7) inside the DUT receptacle 700. The rear side 750 (FIG. 9) of the DUT receptacle 700 is sufficiently inserted to enable the second connector 714 (FIG. 9) of the DUT receptacle 700 to mate with the electrical connector 26 of the docking unit 20, to enable the first air guide 722 (FIG. 9) of the DUT receptacle 700 to mate with the first air opening 22 of the docking unit 20, and to enable the second air guide 724 (FIG. 9) of the DUT receptacle 700 to mate with the second air opening 24 of the docking unit 20.

Returning to FIG. 10, the DUT testing module 100 includes a DUT test execution unit 30 and an intermediate connector 32 in accordance with an embodiment. The DUT test execution unit 30 includes a connector 31. The connector 31 is coupled to the intermediate connector 32, which is coupled to the connector 26 of the docking unit 20. The intermediate connector 32 protects the connector 31 from the wear and tear over time associated with insertion and removal of the DUT receptacle 700 with respect to the cavity 25, avoiding the need to replace the DUT test execution unit 30 due to damage to the connector 31. In an embodiment, the intermediate connector 32 and the connector 26 are easily replaceable. In an alternate embodiment, the connector 31 directly connects with the connector 26 of the docking unit 20.

Operating in the individualized automated testing environment established by the DUT testing module 100 and the DUT receptacle 700, the DUT test execution unit 30 is operable to perform a test on the DUT 800 (FIG. 7) that is inside of the DUT receptacle 700. The DUT test execution unit 30 further includes electronic components to enable the DUT test execution unit 30 to set-up, start, monitor, log, and end a test for the DUT 800 (FIG. 7) that is inside of the DUT receptacle 700. In an embodiment, the test is custom selected based on identification information of the DUT 800 (FIG. 7). For example, if the identification information of the DUT 800 (FIG. 7) designates the DUT 800 (FIG. 7) as being a SSD with 500 GB storage capacity and a specific set of features, a customized test for the SSD with 500 GB storage capacity and the specific set of features will be selected. Further, if the identification information of the DUT 800 (FIG. 7) designates the DUT 800 (FIG. 7) as being a SSD with 1 TB storage capacity and a specific group of features, a customized test for the SSD with 1 TB storage capacity and the specific group of features will be selected.

In an embodiment, the DUT test execution unit 30 electronically communicates through the connector 31, the connector 32, and the connector 26, which is coupled to the second connector 714 (FIG. 9) of the DUT receptacle 700, i) to send test inputs, test commands, and/or any other input information to or ii) to receive test outputs, test responses, and/or any other output information from the DUT 800 (FIG. 7) inside the DUT receptacle 700. The second connector 714 (FIGS. 7 and 9) of the DUT receptacle 700 electrically communicates with the electrical interface 710 (FIG. 7) of the DUT receptacle 700, which electrically communicates with the DUT 800 (FIG. 7) via the first connector 712 (FIG. 7).

Further, the DUT test execution unit 30 ensures the air mixing chamber 10 furnishes the controlled temperature to the DUT receptacle 700 to comply with the test conditions of the test performed on the DUT 800 (FIG. 7) that is inside of the DUT receptacle 700. Moreover, via the connector 31, the connector 32, and the connector 26, which is coupled to the second connector 714 (FIG. 9) of the DUT receptacle 700, the DUT test execution unit 30 receives the measured temperature from the temperature sensor (not shown) located in the interior of the DUT receptacle 700 and makes appropriate adjustments to the controlled temperature to comply with the test conditions of the test performed on the DUT 800 (FIG. 7) that is inside of the DUT receptacle 700.

There are many different types of tests which the DUT 800 (FIG. 7) that is inside of the DUT receptacle 700 may be subjected. The different types of tests include, but not limited to, functionality tests, reliability tests, and stress tests. There are also different types of tests that may be variations of or subtypes of the functionality tests, reliability tests, and stress tests. The goal of a functionality test is to determine whether the DUT 800 (FIG. 7) operates as it is designed to operate. This may include characterizing a plurality of properties, such as clock speed, power usage, response time, etc. The aim of a reliability test is to determine how aging, temperature, and other factors affect the useful lifetime of the DUT 800 (FIG. 7). Accelerated aging of the DUT 800 (FIG. 7) may be achieved by operating the DUT 800 (FIG. 7) in a high temperature environment for an extended period of time. This is also referred to as a burn-in test. Further, the objective of a stress test is to uncover the impact of extreme conditions, such as unusual cold temperature, unusual hot temperature, high voltages, high currents, and etc., on the DUT 800 (FIG. 7). For example, military and heavy industrial environments regularly experience extreme conditions.

In an embodiment, the DUT testing module 100 is configurable by exchanging its DUT test execution unit 30 for another DUT test execution unit 30. As discussed above, there are many different types of tests which the DUT 800 (FIG. 7) that is inside of the DUT receptacle 700 may be subjected. To perform a functionality test, the DUT test execution unit 30 is designed with a wide variety of features and high performance electronics, which are more than sufficient to also perform a reliability test or a stress test. This design is a high cost design. However, to perform either a reliability test or a stress test, a limited set of features and modest performance electronics are sufficient to enable the DUT test execution unit 30 to perform the test task, reducing costs. Accordingly, there may be variations of the DUT testing module 100. In an embodiment, the DUT test execution unit 30 with the wide variety of features and high performance electronics is selected and incorporated into a DUT testing module 100 focused on performing the functionality test while the DUT test execution unit 30 with the limited set of features and modest performance electronics is selected and incorporated into a DUT testing module 100 focused on performing either the reliability test or the stress test.

FIG. 12 illustrates a front perspective view of the DUT testing module 100 of FIG. 10 in accordance with an embodiment, showing the DUT testing module 100 with housing walls and showing a DUT receptacle 700 inserted into the DUT testing module 100. As depicted in FIG. 12, the DUT testing module 100 includes a housing 50 that at least partially encloses the air mixing chamber 10, the docking unit 20, and the DUT test execution unit 30. Moreover, the DUT testing module 100 has a length L. In an embodiment, the housing 50 is comprised of steel sheet metal.

Tester

Figure 13:
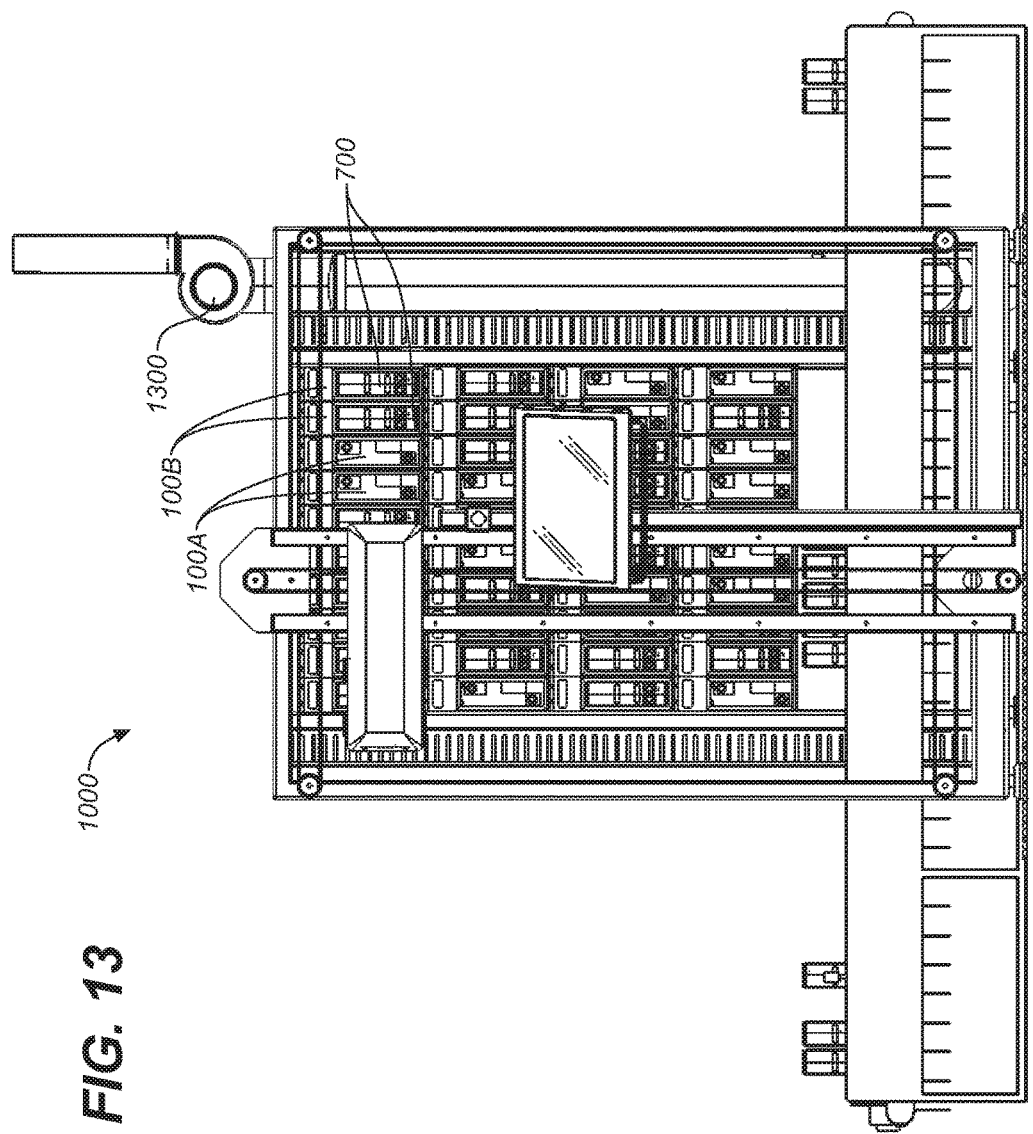
FIG. 13 illustrates a front side of a tester in accordance with an embodiment, showing DUT testing modules and DUT receptacles.

Now, a brief description will be given of the tester. With the housing 50 installed, the DUT testing module 100 may be operated as an exchangeable or replaceable module of a tester 1000 as depicted in FIG. 13. Specifically, FIG. 13 illustrates a front side of a tester 1000 in accordance with an embodiment, showing DUT testing modules 100A and 100B and DUT receptacles 700. As shown in FIG. 13, the tester 1000 includes a plurality of DUT testing modules 100A and 100B. The description of the DUT testing module 100 is equally applicable to DUT testing modules 100A and 100B. DUT receptacles 700 are inserted in the DUT testing modules 100B but not in the DUT testing modules 100A on the front side of the tester 1000. It should be understood that the tester 1000 is not limited to the illustration of FIG. 13.

Continuing with FIG. 13, the tester 1000 offers numerous features for operating the individualized automated testing environments established by the DUT testing modules 100A and 100B in combination with the DUT receptacles 700. The tester 1000 is configured to supply power to the DUT testing modules 100A and 100B and the DUT receptacles 700 via DUT testing modules 100A and 100B. Additionally, the tester 1000 includes a high temperature air source (not shown) and a low temperature air source (not shown). The high temperature air source (not shown) may be coupled to the first valve 13 (FIG. 10), which is coupled to the first air inlet 12 (FIG. 10) of DUT testing modules 100 (FIG. 10), 100A, and 100B. The first air inlet 12 is operable to receive the high temperature air flow. In an embodiment, the high temperature air flow is at a temperature of 85° C. The low temperature air source (not shown) may be coupled to the second valve 15 (FIG. 10), which is coupled to the second air inlet 14 (FIG. 10). The second air inlet 14 is operable to receive the low temperature air flow. In an embodiment, the low temperature air flow is at a temperature of −10° C.

Further, the tester 1000 has a negative pressure blower 1300. In operation, the negative pressure blower 1300 forces or directs the interior air from the DUT receptacles 700 to an external environment to ventilate or to an air recycling mechanism. The interior air from the DUT receptacles 700 travels via the hose 19 (FIG. 10) coupled to the second air opening 24 (FIG. 10) of the DUT testing modules 100 (FIG. 10), 100A, and 100B.

In sum, the tester 1000 is a self-contained unit. Moreover, the tester 1000 facilitates simultaneous operation of individualized automated testing environments (established by the DUT testing modules 100A and 100B in combination with the DUT receptacles 700) which may involve different types of DUTs 800 (FIG. 7) undergoing different types of tests and/or progressing at different stages of testing while the DUTs 800 (FIG. 7) are at different controlled temperatures within the interior of the DUT receptacles 700.

Test Floor Equipment

Figure 4:
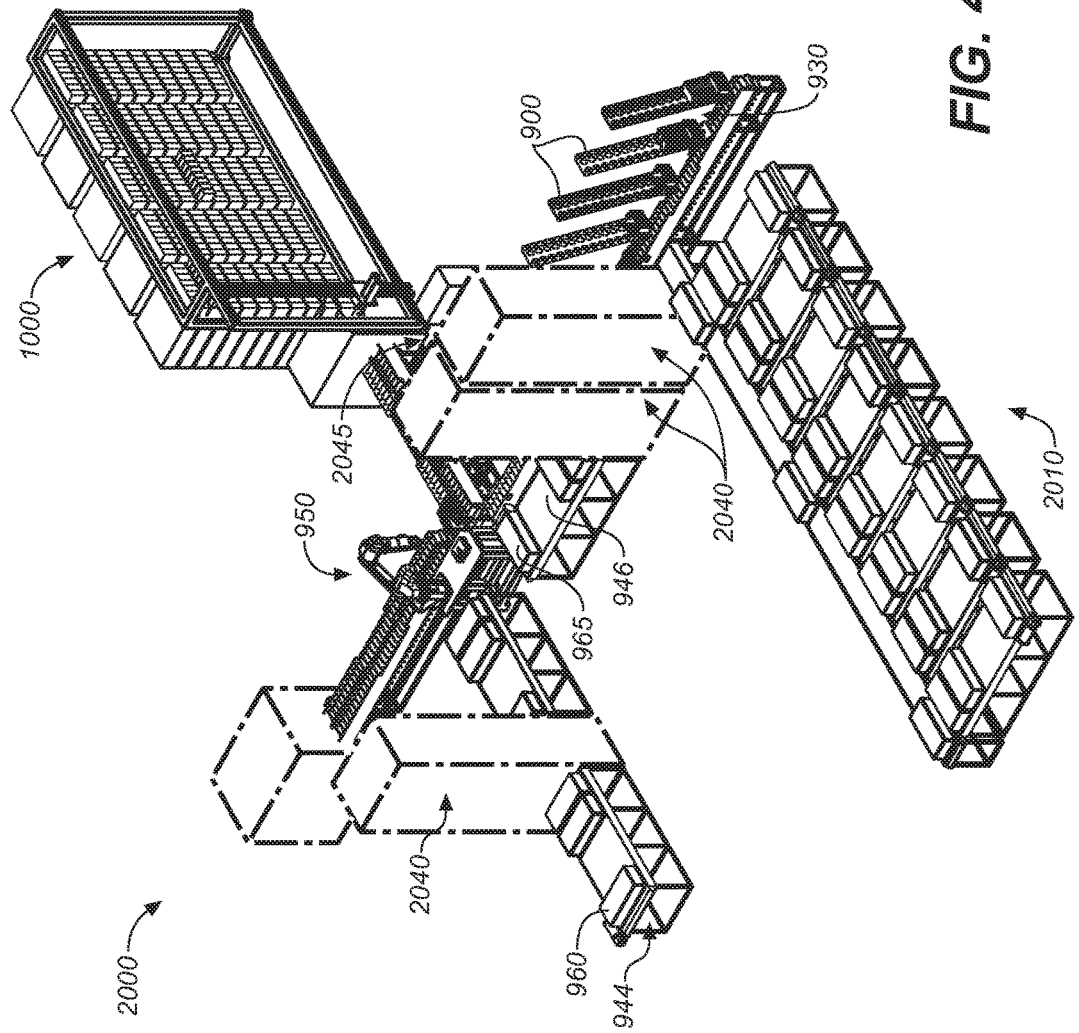
FIG. 4 shows a test floor system controllable by the automated control configuration of FIG. 1 in accordance with an embodiment.

Now, a brief description will be given of the test floor equipment. FIG. 4 shows a test floor system 2000 controllable by the automated control configuration 200 of FIG. 1 in accordance with an embodiment. Consequently, implementation of the individualized automated testing environment of the new paradigm for automated device testing is available.

The test floor system 2000 includes various stations and automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045). In accordance with an embodiment, the various stations and automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 operate cooperatively by being configured to communicate with each other or with the automated control configuration 200 (FIG. 1) and by being configured to track or monitor their operations. This achieves the implementation of automated testing of different types of devices (or DUTs) of different form factors and different published specifications on a single platform (or test floor) of the test floor system 2000.

Figure 5:
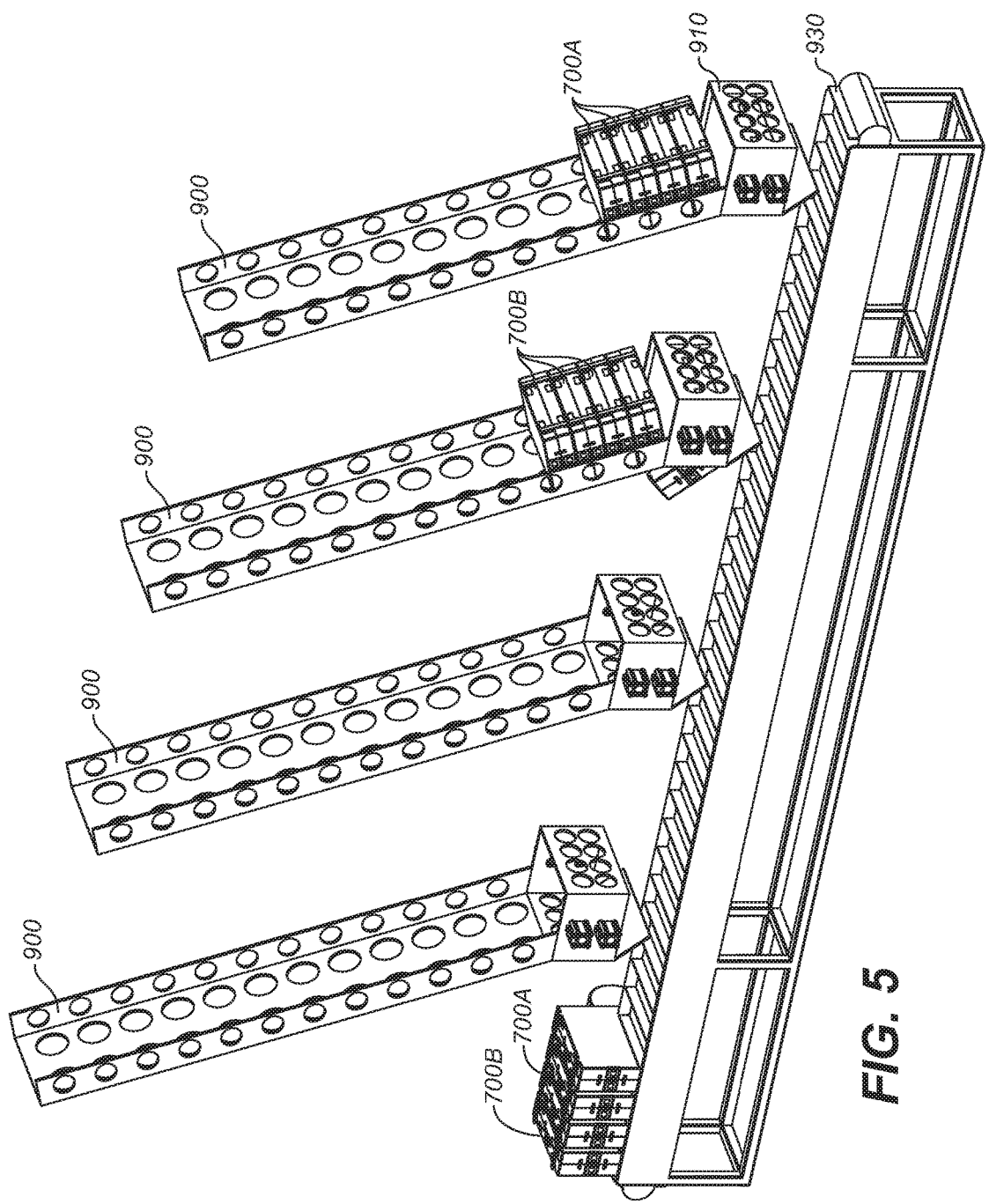
FIG. 5 depicts a plurality of vertical stack buffers in a test floor in accordance with an embodiment, showing DUT receptacles of different types.

FIG. 5 depicts a plurality of vertical stack buffers 900 in a test floor in accordance with an embodiment, showing DUT receptacles 700A and 700B of different types before a DUT or DUTs 800 (FIG. 7) is inserted inside the DUT receptacles 700A and 700B. It should be understood that the vertical stack buffers 900 are not limited to the illustrations of FIGS. 4 and 5. The automated control configuration 200 (FIG. 1) is configured to control operation of the vertical stack buffers 900.

The vertical stack buffer 900 operates cooperatively with a conveyor 930. The conveyor 930 may be a flighted index conveyor in accordance with an embodiment. The conveyor 930 holds the DUT receptacle 700A and 700B upright and moves it towards a station where the DUT 800 (FIG. 7) will be inserted into DUT receptacle 700A and 700B. Additionally, the vertical stack buffer 900 includes a release mechanism 910 to release and drop a single DUT receptacle 700A and 700B at a time on the conveyor 930 when a specific DUT receptacle type is needed in view of the corresponding DUT 800 (FIG. 7) to be tested. That is, a single DUT receptacle 700A and 700B may be placed or dropped on the conveyor 930 on-demand. For example, if a SSD with 500 GB storage capacity, 2.5" SSD form factor, and compliant with the SAS specification will be tested, the release mechanism 910 of the vertical stack buffer 900 may place the DUT receptacle 700A on the conveyor 930. However, if a SSD with 1 TB storage capacity, 1.8" SSD form factor, and compliant with the SATA specification will be tested, the release mechanism 910 of the vertical stack buffer 900 may places the DUT receptacle 700B on the conveyor 930 instead of the DUT receptacle 700A.

Figure 6:
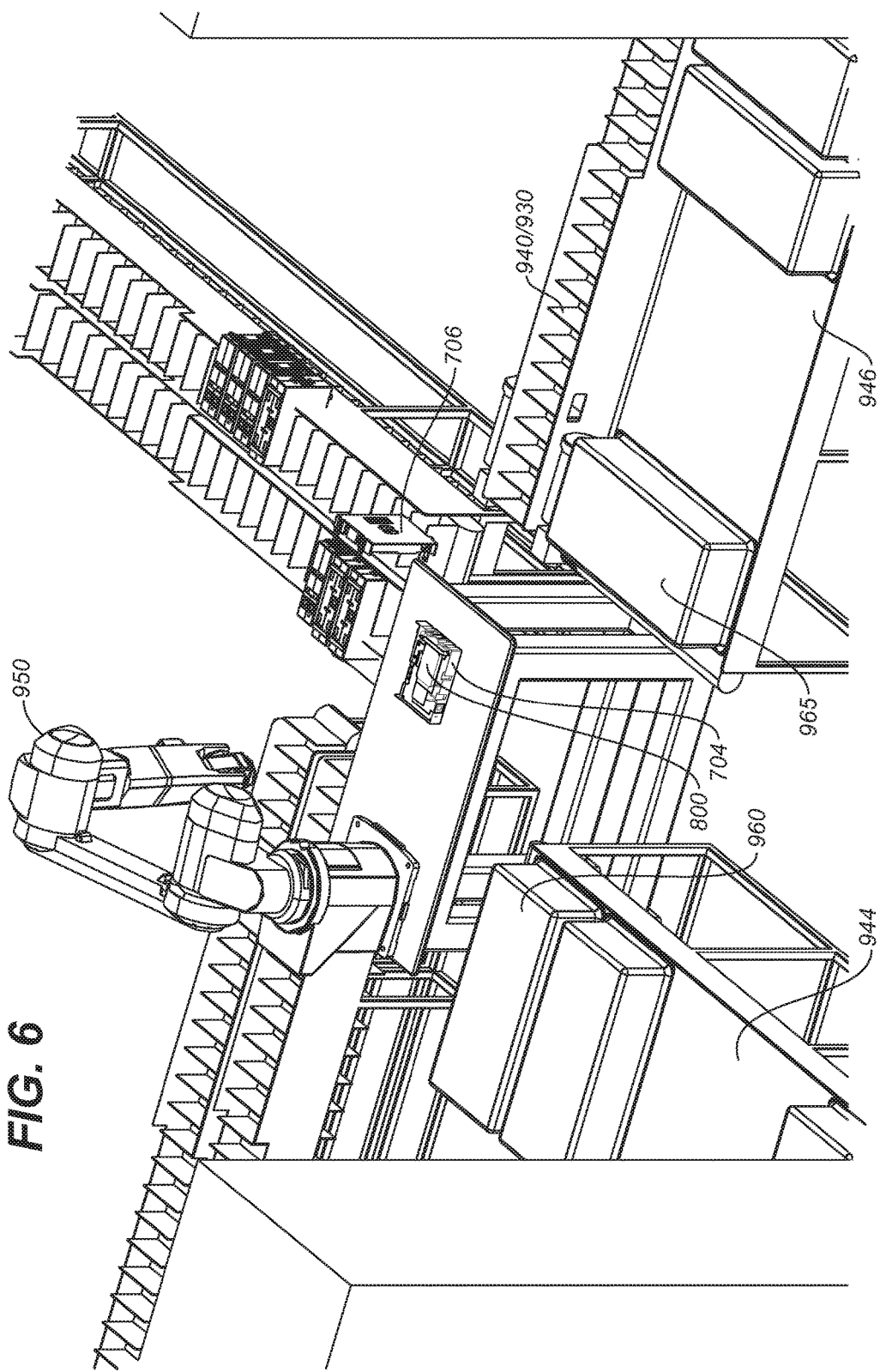
FIG. 6 illustrates an automated handling station in a test floor in accordance with an embodiment.

Now focusing on FIG. 6, an automated handling station 950 in a test floor is illustrated in accordance with an embodiment. The automated handling station 950 is not limited to the illustrations of FIGS. 4 and 6. The automated control configuration 200 (FIG. 1) is configured to control operation of the automated handling station 950.

In an embodiment, the automated handling station 950 is implemented as a robotic apparatus. The automated handling station 950 is operable to access the DUT receptacle 700A and 700B (FIG. 5) from a conveyor. Further, the automated handling station 950 is operable to open the DUT receptacle 700A and 700B (FIG. 5) to position a corresponding DUT 800 (FIG. 7) in a manner that couples the corresponding DUT 800 to an electrical interface 710 (FIG. 7) of the DUT receptacle 700A and 700B (FIG. 5). Also, the automated handling station 950 positions the corresponding DUT 800 in a manner that encloses the corresponding DUT 800 inside the DUT receptacle 700A and 700B (FIG. 5) to facilitate testing of the corresponding DUT 800 with a DUT testing module 100 (FIG. 10), 100A (FIG. 13), and 100B (FIG. 13) of a tester 1000 (FIG. 13). After testing, the automated handling station 950 is operable to open the DUT receptacle 700A and 700B (FIG. 5) and unload the corresponding DUT 800.

Automated Control

Now, detailed description of automated control will be provided. The automated control along with DUT testing modules, testers, and test floor equipment implement the individualized automated testing environment of the new paradigm for automated device testing.

Figure 1:
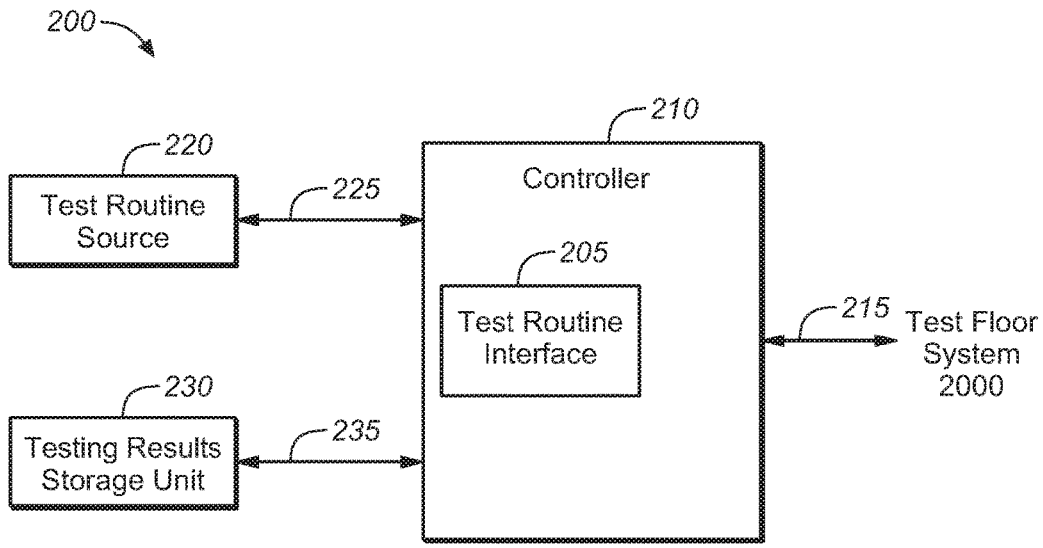
FIG. 1 depicts an automated control configuration for automated testing of devices in accordance with an embodiment.

FIG. 1 depicts an automated control configuration 200 for automated testing of devices in accordance with an embodiment. The automated control configuration 200 enables automated testing of different types of devices (or DUTs) of different form factors and different published specifications on a single platform (or test floor). It should be understood that the automated control configuration 200 is not limited to the illustration of FIG. 1.

The automated control configuration 200 is operable to orchestrate the operation of the test floor system 2000 (FIG. 4) to implement the individualized automated testing environment of the new paradigm for automated device testing. Consequently, different types of devices (or DUTs) of different form factors and different published specifications may be concurrently tested on the same test floor system 2000 (FIG. 4). As an example, a SSD (or DUT type 1) with 500 GB storage capacity, 2.5" SSD form factor, and compliant with the SAS specification may be concurrently tested on the test floor system 2000 (FIG. 4) with a SSD (or DUT type 2) with 1 TB storage capacity, 1.8" SSD form factor, and compliant with the SATA specification.

In an embodiment, the automated control configuration 200 includes a controller 210, a test routine source 220, and a testing results storage unit 230. It should be understood that the controller 210, the test routine source 220, and the testing results storage unit 230 may be implemented as separate devices (as shown in FIG. 1), may be implemented on a single integrated device, and/or may be implemented as sub-combinations (e.g., combination of the test routine source 220 and the testing results storage unit 230, combination of the controller 210 and the testing results storage unit 230, combination of the controller 210 and the test routine source 220, etc.). Further, it should be understood that any one of the controller 210, the test routine source 220, or the testing results storage unit 230 may be co-located with the test floor system 2000 (FIG. 4), may be co-located with another component of the automated control configuration 200, may be located in a different place with respect to the location of the test floor system 2000 (FIG. 4), and/or may be located in a different place with respect to another component of the automated control configuration 200.

Since the automated control configuration 200 coordinates the testing of different DUTs (e.g., DUT type 1, DUT type 2, DUT 800 (FIG. 7), etc.) on the test floor system 2000 (FIG. 4), the automated control configuration 200 causes the test floor system 2000 (FIG. 4) to obtain and to send identification information (e.g., serial number, product code, etc.) of the different DUTs (e.g., DUT type 1, DUT type 2, DUT 800 (FIG. 7), etc.) to the automated control configuration 200. The identification information may be obtained while the DUT is either inside of the DUT receptacle 700 (FIG. 7) or outside of the DUT receptacle 700 (FIG. 7). Linear barcodes, 2-dimensional barcodes, radio frequency identification (RFID), and near-field communication (NFC) are examples of technologies for assigning a unique identify (or identification information) to each DUT and for determining the unique identity of each DUT on the test floor system 2000 (FIG. 4). Additionally, power may be supplied to the DUT to enable the DUT to output its identification information (e.g., serial number, product code, etc.). For example, in FIG. 13, if the DUT receptacle 700 (which holds a DUT) is inserted into the DUT testing module 100A of the tester 1000, the tester 1000 supplies power to the DUT enclosed by the DUT receptacle 700 via the DUT testing module 100A to cause the DUT to output its identification information.

The automated control configuration 200 is operable to utilize the identification information of the DUT in a number of ways. In an embodiment, the test floor system 2000 (FIG. 4) handles DUT receptacles of different types. The identification information of the DUT aids the automated control configuration 200 in selecting an appropriate DUT receptacle type for the DUT. The selection is communicated to the vertical stack buffers 900 (FIG. 5) of the test floor system 2000 (FIG. 4) to cause the vertical stack buffers 900 (FIG. 5) to release and drop the appropriate DUT receptacle type for the DUT on the conveyor 930 (FIG. 5). Also, the identification information of the DUT permits the automated control configuration 200 to track the DUT as it moves through the test floor system 2000 (FIG. 4), to direct the DUT in the correct direction through the test floor system 2000 (FIG. 4), and to synchronize the movement of the DUT with respect to other DUTs, empty or occupied DUT receptacles 700 (FIG. 7), empty or occupied DUT testing modules 100A and 100B (FIG. 13), and various stations and automated test floor equipment of the test floor system 2000 (FIG. 4).

Additionally, the identification information of the DUT assists the automated control configuration 200 in determining an appropriate test routine for the DUT to be tested and to send the appropriate test routine to the DUT testing module 100A (FIG. 13) of the tester 1000 (FIG. 13), where the DUT testing module 100A holds the DUT receptacle 700 that encloses the DUT to be tested by the DUT testing module 100A. For example, if the identification information of the DUT 800 (FIG. 7) designates the DUT 800 (FIG. 7) as being a SSD with 500 GB storage capacity and a specific set of features, an appropriate test routine for the SSD with 500 GB storage capacity and the specific set of features is determined and sent. However, if the identification information of the DUT 800 (FIG. 7) designates the DUT 800 (FIG. 7) as being a SSD with 1 TB storage capacity and a specific group of features, an appropriate test routine for the SSD with 1 TB storage capacity and the specific group of features is determined and sent. That is, the appropriate test routine is a customized test routine for the DUT to be tested while the identification information reveals the identity of the DUT to be tested and makes possible the furnishing of the appropriate test routine. If the DUT is tested with the incorrect test routine, invalid results are obtained and the DUT may be damaged.

Referring again to FIG. 1, the automated control configuration 200 has a controller 210, a test routine source 220, and a testing results storage unit 230 according to an embodiment.

The controller 210 is operable to control and to synchronize the operation of the test floor system 2000 (FIG. 4) in an automated manner. In an embodiment, the controller 210 includes at least one communication link 215 with the test floor system 2000 (FIG. 4). The communication link 215 may be wired or wireless. Also, the communication link 215 may be coupled to a communication network. The controller 210 is operable to communicate with individual stations and individual automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 (FIG. 4). Additionally, the controller 210 may communicate with individual stations and individual automated test floor equipment via other stations and automated test floor equipment of the test floor system 2000 (FIG. 4). The communication link 215 enables the controller 210 i) to send test routines, messages, commands, and/or any other input information to or ii) to receive test results, identification information of DUTs, messages, responses, and/or any other output information from the various stations and automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 (FIG. 4).

Continuing, the controller 210 also includes a test routine interface 205, a communication link 225 with the test routine source 220, and a communication link 235 with the testing results storage unit 230. The communication links 225 and 235 may be wired or wireless. Also, the communication links 225 and 235 may be coupled to a communication network. Once the controller 210 receives the identification information (e.g., serial number, product code, etc.) of the DUT enclosed in a DUT receptacle 700 (FIG. 13) that is inserted into a DUT testing module 100A (FIG. 13) of the tester 1000 (FIG. 13), the test routine interface 205 facilitates obtaining an appropriate test routine for the DUT to be tested from the test routine source 220. Besides receiving the identification information of the DUT to be tested, the controller 210 also receives the identity, the location (e.g., identity of tester 1000 (FIG. 13) from several available testers and location within the tester 1000 (FIG. 13)), and the DUT testing module type of the DUT testing module 100A (FIG. 13). There are many different types of tests which the DUT that is inside of the DUT receptacle 700 may be subjected. The different types of tests include, but not limited to, functionality tests, reliability tests, and stress tests. Accordingly, the DUT testing module type indicates the type of test(s) the DUT testing module 100A (FIG. 13) is able to perform on the DUT to be tested.

The test routine source 220 is operable to provide the controller 210 with an appropriate test routine to perform on the DUT to be tested in response to the controller 210 furnishing the identification information (e.g., serial number, product code, etc.) of the DUT to the test routine source 220. The controller 210 may also inform the test routine source 220 of the DUT testing module types available in the tester(s) 1000 (FIG. 13) and the DUT testing module type of the DUT testing module that will perform testing on the DUT. In an embodiment, the test routine is a sequence of tasks, steps, and/or operations to subject the DUT during testing, where the tasks, steps, and/or operations include temperature and/or input conditions under which they should be performed. The test routine may have multiple stages. In an embodiment, the test routine source 220 is a production server operable to keep track of details of manufactured devices (or DUTs).

In addition to providing the appropriate test routine, the test routine source 220 may make requests to the controller 210. The requests may relate to any aspect of testing the DUT. In an embodiment, the requests may be given to the controller 210 via a graphical user interface (GUI) or a command line interface (CLI). As noted above, there are different types of tests. The controller 210 may be requested to perform a first type of test (e.g., functionality test) on the DUT and then to perform a second type of test (e.g., stress test) on the DUT. More than two types of tests may be serially performed on the DUT. In an embodiment, an appropriate test routine is utilized for each test type. That is, the controller 210 obtains a first test routine for the first type of test and obtains a second test routine for the second type of test. Additionally, the controller 210 may be requested to inform the test routine source 220 of the progress and intermediate results of the testing on the DUT. Consequently, the test routine source 220 has the opportunity to prematurely terminate testing or to continue testing despite the DUT failing one or more stages of the testing routine. Further, the test routine source 220 may customize the delivery of testing results of the DUT. Requests concerning the type, the format, and/or the destination for the testing results of the DUT may be supplied to the controller 210. For example, the controller 210 may be requested to store the testing results of the DUT in the testing results storage unit 230, which is operable to store testing results. In an embodiment, the testing results storage unit 230 is a database.

As noted above, the controller 210 includes the test routine interface 205 operable to facilitate obtaining an appropriate test routine for the DUT to be tested from the test routine source 220. In an embodiment, the test routine interface 205 makes available an automation template to capture the content of the appropriate test routine from the test routine source 220. In an embodiment, the test routine interface 205 translates or converts the appropriate test routine from the test routine source 220 into a format suitable for the tester 1000 and the DUT testing modules 100A and 100B (FIG. 13) of the test floor system 2000 (FIG. 4). Additionally, the test routine interface 205 assists in reading the testing results from the tester 1000 (FIG. 13) and the DUT testing modules 100A and 100B (FIG. 13).

Figure 2:
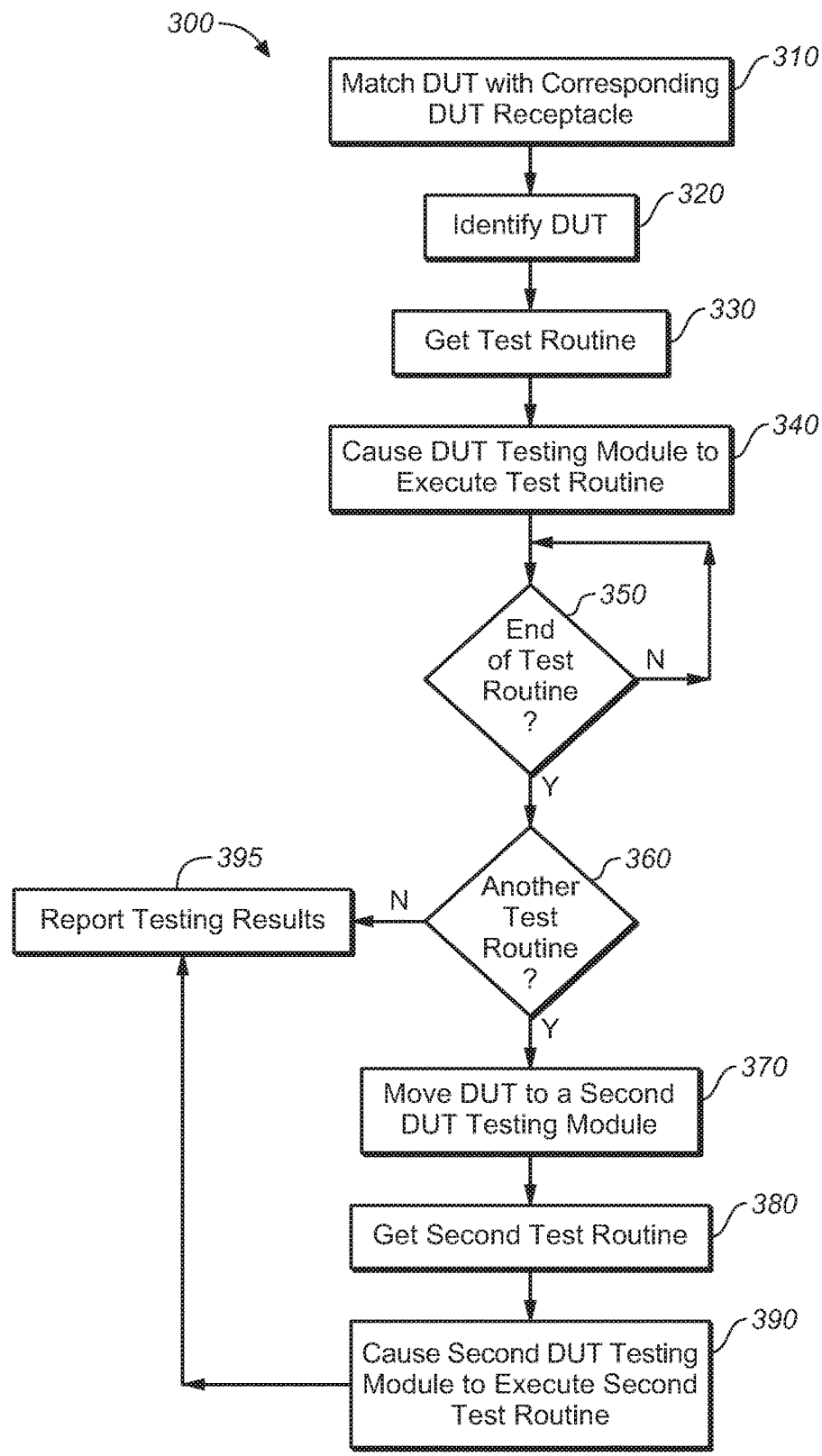
FIG. 2 illustrates a first method of operation of the automated control configuration of FIG. 1 in accordance with an embodiment.

FIG. 2 illustrates a first method 300 of operation of the automated control configuration 200 of FIG. 1 in accordance with an embodiment. It should be understood that operation of the automated control configuration 200 of FIG. 1 is not limited to the operation shown in FIG. 2.

The automated control configuration 200 ensures coordinated and cooperative operation of the test floor system 2000 (FIG. 4) even though different types of DUTs may be concurrently tested by the test floor system 2000 (FIG. 4). In an embodiment, the automated control configuration 200 is operable to communicate with individual stations and individual automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 (FIG. 4). As discussed above, the test floor system 2000 (FIG. 4) is suitable to operate with DUT receptacles 700A and 700B (FIG. 5) of different types.

The test floor system 2000 (FIG. 4) sends identification information of the DUT to be tested to aid the automated control configuration 200 in matching the DUT with an appropriate DUT receptacle type, at 310. The match made by the automated control configuration 200 is communicated to the vertical stack buffers 900 (FIG. 5) of the test floor system 2000 (FIG. 4) to cause the vertical stack buffers 900 (FIG. 5) to release and drop the appropriate DUT receptacle type for the DUT on the conveyor 930 (FIG. 5). At the automated handling station 950 (FIGS. 4 and 6), the DUT is inserted into the DUT receptacle 700 (FIG. 7) in a manner that couples the DUT to an electrical interface 710 of the DUT receptacle 700 and that encloses the DUT inside the DUT receptacle 700 to facilitate testing of the DUT. The test floor system 2000 (FIG. 4) transports (e.g., via conveyors) the DUT receptacle 700 that encloses the DUT to a tester 1000 of the test floor system 2000. At the tester 1000, the automated gripper of the tester 1000 securely inserts the DUT receptacle 700 into a DUT testing module 100 of the tester 1000 in an automated manner. In an embodiment, the automated gripper uses the first slot 732 and the second slot 734 of the DUT receptacle 700 to securely grip the DUT receptacle 700.

If the automated control configuration 200 has not received sufficient identification information of the DUT to be tested by the DUT testing module 100 of the tester 1000 from the test floor system 2000, power may be supplied to the DUT to enable the DUT to output its identification information (e.g., serial number, product code, etc.) to permit the test floor system 2000 to determine the identity of the DUT, at 320. For example, in FIG. 13, if the DUT receptacle 700 (which holds a DUT) is inserted into the DUT testing module 100A of the tester 1000, the tester 1000 supplies power to the DUT enclosed by the DUT receptacle 700 via the DUT testing module 100A to cause the DUT to output its identification information.

The identification information of the DUT is furnished to the test routine source 220 (FIG. 1), at 330. Moreover, the test routine source 220 is made aware of the types of tests (e.g., functionality tests, reliability tests, stress tests, etc.) the DUT testing module 100 is capable of performing. The test routine source 220 provides an appropriate test routine based on the identification information of the DUT and the type of test to be performed. The automated control configuration 200 sends the appropriate test routine to the correct DUT testing module 100 for testing the DUT.

Continuing, the DUT testing module 100 starts executing the appropriate test routine to perform testing on the DUT, at 340. This represents the individualized automated testing environment of the new paradigm for automated device testing. The progress of the appropriate test routine is monitored by the automated control configuration 200, at 350. As discussed above, the test routine source 220 may prematurely terminate testing of the DUT if the DUT fails one or more stages of the appropriate test routine.

If the DUT testing module 100 completes performing the appropriate test routine on the DUT, the automated control configuration 200 determines whether another type of test is to be performed on the DUT, at 360. If no additional testing is to be performed on the DUT, the testing results are reported and delivered, at 395. For example, the testing results may be stored in the testing results storage unit 230 in a customized manner.

If another type (or second type) of test is to be performed on the DUT, the automated gripper of the tester 1000 moves and securely inserts the DUT receptacle 700 into another DUT testing module (or second DUT testing module) 100 of the tester 1000 in an automated manner under the direction of the automated control configuration 200, at 370. The second DUT testing module 100 is designed to perform the second type of test on the DUT.

Again, the identification information of the DUT is furnished to the test routine source 220 (FIG. 1), at 380. Moreover, the test routine source 220 is made aware of the types of tests (e.g., functionality tests, reliability tests, stress tests, etc.) the second DUT testing module 100 is capable of performing. The test routine source 220 provides another appropriate test routine (or second test routine) based on the identification information of the DUT and the type of test to be performed. The automated control configuration 200 sends the second test routine to the second DUT testing module 100 for testing the DUT.

The second DUT testing module 100 starts executing the second test routine to perform testing on the DUT, at 390. The progress of the second test routine is monitored by the automated control configuration 200. As noted above, the test routine source 220 may prematurely terminate testing of the DUT if the DUT fails one or more stages of the second test routine. The second DUT testing module 100 completes performing the second test routine on the DUT. The testing results are reported and delivered, at 395. For example, the testing results may be stored in the testing results storage unit 230 in a customized manner.

Although FIG. 2 focuses on the testing of a DUT, the discussion of FIG. 2 is equally applicable to simultaneous or concurrently testing of numerous DUTs of different types in the test floor system 2000 (FIG. 4) under the control and supervision of the automated control configuration 200 of FIG. 1.

Figure 3:
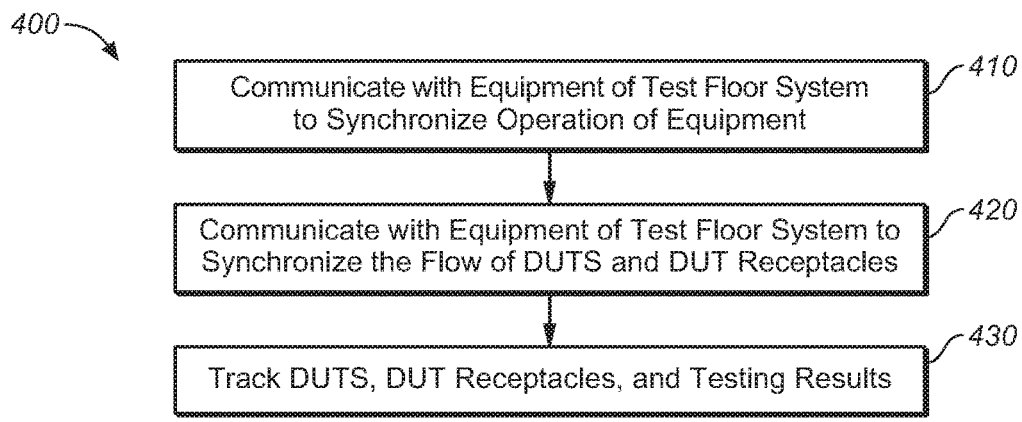
FIG. 3 illustrates a second method of operation of the automated control configuration of FIG. 1 in accordance with an embodiment.

FIG. 3 illustrates a second method 400 of operation of the automated control configuration 200 of FIG. 1 in accordance with an embodiment. It should be understood that operation of the automated control configuration 200 of FIG. 1 is not limited to the operation shown in FIG. 3.

The automated control configuration 200 communicates with and synchronizes the operation of individual stations and individual automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 (FIG. 4), at 410.

Further, the automated control configuration 200 communicates with and synchronizes flow of DUTs and DUT receptacles 700 through individual stations and individual automated test floor equipment (e.g., tester 1000, automated handling station 950, vertical stack buffers 900, conveyor 930, binning station 2010, pre-test tote 960, conveyor 944, post-test tote 965, conveyor 946, vertical rotating buffers for totes 2040, and vertical rotating buffer for DUT receptacles 2045) of the test floor system 2000 (FIG. 4), at 420.

Furthermore, the automated control configuration 200 tracks the different DUT types, DUT receptacles 700, and testing results in an automated manner in the test floor system 2000 (FIG. 4), at 430.

Consequently, automated testing of different types of DUTs of different form factors and different published specifications on a single platform (or the test floor system 2000) is realized. Also, implementation of an individualized automated testing environment of the new paradigm for automated device testing in the test floor system 2000 is realized.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A method, comprising:
causing a test floor system to insert a DUT (device under test) into a DUT receptacle in a manner that couples the DUT to an electrical interface of the DUT receptacle and that encloses the DUT inside the DUT receptacle to facilitate testing of the DUT;
causing the test floor system to transport the DUT receptacle that encloses the DUT to a tester of the test floor system and to insert the DUT receptacle into a DUT testing module of the tester, wherein the DUT testing module includes a first air hose operable to deliver an air flow into the DUT receptacle and a second air hose operable to carry out an interior air flow from inside the DUT receptacle;
causing the test floor system to determine identification information of the DUT; and
based on the identification information, sending a test routine to the DUT testing module to perform on the DUT.

2. The method of claim 1, wherein the DUT comprises one of a plurality of different device types.

3. The method of claim 2, wherein the plurality of different device types includes a first solid state drive having a first storage capacity and a second solid state drive having a second storage capacity.

4. The method of claim 2, wherein the plurality of different device types includes a first solid state drive comprising a first form factor and a second solid state drive comprising a second form factor.

5. The method of claim 2, wherein the plurality of different device types includes a first solid state drive compliant with a first specification and a second solid state drive compliant with a second specification.

6. The method of claim 1, wherein the DUT receptacle comprises one of a plurality of DUT receptacle types.

7. The method of claim 1, wherein the DUT testing module comprises one of a plurality of DUT testing module types.

8. The method of claim 1, wherein the DUT testing module is operable to couple to and to use the electrical interface to perform a test at a controlled temperature on the DUT that is inside of the DUT receptacle.

9. The method of claim 8, wherein the DUT testing module is operable to use the electrical interface to send input information to and to receive output information from the DUT.

10. A method, comprising:
causing a test floor system to insert a plurality of different types of DUTS (devices under test) into a plurality of respective DUT (device under test) receptacles of a plurality of DUT receptacle types;
causing the test floor system to transport the plurality of respective DUT receptacles that enclose the plurality of different types of DUTS to a tester of the test floor system and to insert the plurality of respective DUT receptacles into a plurality of respective DUT testing modules of the tester, wherein at least one of the respective DUT testing modules includes a first air hose operable to deliver an air flow into the respective DUT receptacle and a second air hose operable to carry out an interior air flow from inside the respective DUT receptacle;
causing the test floor system to determine identification information of the plurality of different types of DUTS; and
based on the identification information, sending a plurality of respective test routines to the plurality of respective DUT testing modules to perform on the plurality of different types of DUTS.

11. The method of claim 10, wherein the plurality of different types of DUTS includes a first solid state drive having a first storage capacity and a second solid state drive having a second storage capacity.

12. The method of claim 10, wherein the plurality of different types of DUTS includes a first solid state drive comprising a first form factor and a second solid state drive comprising a second form factor.

13. The method of claim 10, wherein the plurality of different types of DUTS includes a first solid state drive compliant with a first specification and a second solid state drive compliant with a second specification.

14. The method of claim 10, wherein each respective DUT receptacle includes an electrical interface, and wherein each respective DUT testing module is operable to couple to and to use the electrical interface to perform a test at a controlled temperature on a DUT that is inside of the respective DUT receptacle.

15. The method of claim 14, wherein each respective DUT testing module is operable to use the electrical interface to send input information to and to receive output information from the DUT.

16. The method of claim 10, wherein each respective DUT testing module comprises one of a plurality of DUT testing module types.

17. An apparatus, comprising:
a controller operable to control in an automated manner a test floor system including a tester, wherein the tester includes a plurality of DUT (device under test) testing modules operable to receive and to hold a DUT receptacle that encloses a DUT to facilitate testing of the DUT, wherein at least one of the DUT testing modules includes a first air hose operable to deliver an air flow into the DUT receptacle and a second air hose operable to carry out an interior air flow from inside the DUT receptacle, wherein the controller includes a test routine interface operable to obtain an appropriate test routine to perform on the DUT.

18. The apparatus of claim 17, wherein the DUT comprises one of a plurality of different device types.

19. The apparatus of claim 18, wherein the plurality of different device types includes a first solid state drive having a first storage capacity and a second solid state drive having a second storage capacity.

20. The apparatus of claim 17, wherein the DUT receptacle includes an electrical interface, wherein each DUT testing module is operable to couple to and to use the electrical interface to perform a test at a controlled temperature on the DUT that is inside of the DUT receptacle, and wherein each DUT testing module is operable to use the electrical interface to send input information to and to receive output information from the DUT.

* * * * *